(12) United States Patent
Netzer

(10) Patent No.: US 10,676,345 B2
(45) Date of Patent: Jun. 9, 2020

(54) TEMPERATURE STABILIZED MEMS DEVICE

(71) Applicant: Y-SENSORS LTD., Misgav (IL)

(72) Inventor: Yishay Netzer, Yuvalim (IL)

(73) Assignee: Y-SENSORS LTD., Misgav (IL)

( * ) Notice: Subject to any disclaimer, the term of this patent is extended or adjusted under 35 U.S.C. 154(b) by 12 days.

(21) Appl. No.: 15/677,057

(22) Filed: Aug. 15, 2017

(65) Prior Publication Data

US 2018/0044173 A1 Feb. 15, 2018

Related U.S. Application Data

(60) Provisional application No. 62/494,560, filed on Aug. 15, 2016.

(51) Int. Cl.
*B81B 7/00* (2006.01)
*G01C 19/5769* (2012.01)

(52) U.S. Cl.
CPC ........ *B81B 7/0096* (2013.01); *G01C 19/5769* (2013.01); *B81B 2201/0242* (2013.01)

(58) Field of Classification Search
CPC .. B81B 7/0096; H01L 23/481; B81C 1/00277
See application file for complete search history.

(56) References Cited

U.S. PATENT DOCUMENTS

| | | | |
|---|---|---|---|
| 7,702,226 B1* | 4/2010 | Gutierrez | H04N 5/2252 257/434 |
| 8,610,336 B1* | 12/2013 | Wang | H03H 3/0073 310/343 |
| 8,686,555 B2 | 4/2014 | Yaralloglu et al. | |
| 2009/0072380 A1* | 3/2009 | Tarn | B81C 1/00269 257/700 |
| 2012/0268216 A1* | 10/2012 | Borremans | G05D 23/1928 331/70 |
| 2013/0001765 A1* | 1/2013 | Yaralioglu | H01L 23/345 257/704 |
| 2013/0264610 A1* | 10/2013 | Chen | B81C 1/0023 257/252 |
| 2015/0303141 A1 | 10/2015 | Schrank et al. | |
| 2016/0244324 A1* | 8/2016 | Gurin | B81B 7/0048 |
| 2017/0093361 A1* | 3/2017 | Grosjean | H03H 9/125 |

* cited by examiner

*Primary Examiner* — Matthew L Reames
*Assistant Examiner* — John A Bodnar
(74) *Attorney, Agent, or Firm* — Mark M. Friedman

(57) ABSTRACT

A temperature-stabilized MEMS device in which heat is generated by ohmic heating as an electric current passes through at least part of one of the structural layers of the device. Various implementation options are disclosed in which the heating occurs in a device layer (25) of the device, either in an outer frame (2) or within the area of an active structure (3), or where heating occurs within a substrate (1) or a cover (8) of the device. One application of particular relevance is a gyroscope device.

8 Claims, 2 Drawing Sheets

TEMPERATURE STABILIZED MEMS DEVICE

FIELD AND BACKGROUND OF THE INVENTION

The present invention relates to a temperature-stabilized MEMS device and, in particular, it concerns a temperature-stabilized MEMS device in which heat is generated by ohmic heating by an electric current passing through at least part of one of the structural layers of the device.

MEMS devices such as accelerometers and gyroscopes are temperature sensitive, mainly because of the temperature dependence of the Young modulus of silicon. One approach to minimizing temperature sensitivity of such devices is by heating the MEMS device so as to maintain it at a stable temperature above a maximal expected environmental temperature, e.g. at 90° C. A device employing this approach is sometimes referred to as "ovenized".

Conventional approaches for producing ovenized MEMS devices typically require additional processing steps during manufacture to form heating elements, thereby adding complexity, time and/or costs to the manufacturing process.

SUMMARY OF THE INVENTION

The present invention is a temperature-stabilized MEMS device in which heat is generated by ohmic heating as an electric current passes through at least part of one of the structural layers of the device.

According to the teachings of an embodiment of the present invention there is provided, a MEMS device comprising: a plurality of layers including: (a) a substrate; and (b) a silicon device layer supported by the substrate, the device layer including an active structure, wherein at least one of the plurality of layers is implemented using a doped silicon layer with first and second electrical connection regions located such that at least part of the doped silicon electrically connecting between the first and second electrical connection regions forms a resistive heating element thermally coupled to the active structure of the device layer.

According to a further feature of an embodiment of the present invention, there is also provided a temperature-responsive element selected from the group consisting of: a temperature sensing diode and a temperature sensing resistor, the temperature-responsive element being thermally coupled to the device layer and having first and second sensor-connection regions for sensing an electrical property of the temperature-responsive element.

According to a further feature of an embodiment of the present invention, there is also provided a controller electrically connected to the first and second sensor-connection regions and the first and second electrical connection regions, the controller being configured to receive a signal indicative of a current temperature of the temperature-responsive element, and to selectively apply a voltage across the resistive heating element so as to maintain the current temperature within a target range of temperatures.

There is also provided according to the teachings of an embodiment of the present invention, a method comprising the steps of: (a) providing a MEMS device comprising a plurality of layers including: (i) a substrate; and (ii) a device layer supported by the substrate, the device layer including an active structure, wherein at least one of the plurality of layers is implemented using a doped silicon layer with first and second electrical connection regions located such that at least part of the doped silicon electrically connecting between the first and second electrical connection regions forms a resistive heating element thermally coupled to the active structure of the device layer; (b) sensing a current temperature indicative of a temperature of at least part of the active structure; and (c) selectively applying a voltage across the resistive heating element so as to maintain the current temperature within a target range of temperatures.

According to a further feature of an embodiment of the present invention, the sensing is performed using a temperature-responsive element selected from the group consisting of: a temperature sensing diode and a temperature sensing resistor, the temperature-responsive element being formed as part of the device layer.

According to a further feature of an embodiment of the present invention, the doped silicon layer is the device layer.

According to a further feature of an embodiment of the present invention, the active structure comprises a conductive beam interconnecting between the first and second electrical connection regions such that the conductive beam forms the resistive heating element.

According to a further feature of an embodiment of the present invention, the device layer comprises a frame surrounding the active structure, and wherein the first and second electrical connection regions are located on the frame such that at least part of the frame forms the resistive heating element.

According to a further feature of an embodiment of the present invention, the doped silicon layer is the substrate.

According to a further feature of an embodiment of the present invention, the doped silicon layer is a cover layer deployed over the device layer such that the cover layer, the substrate and a frame of the device layer form a sealed unit around the active structure.

According to a further feature of an embodiment of the present invention, a plurality of legs are employed to deploy the substrate in spaced relation to an underlying surface.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
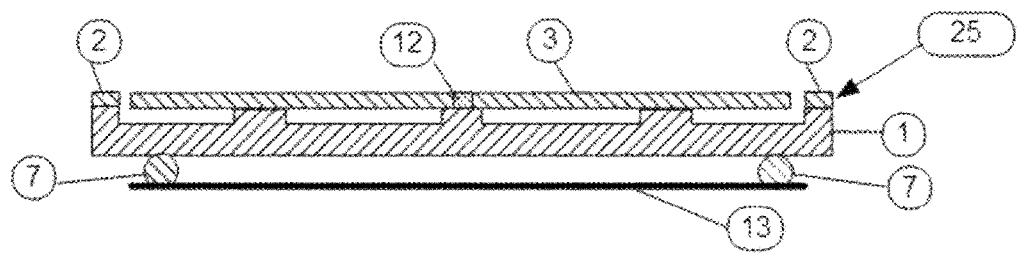
FIG. 1 is a schematic longitudinal cross-sectional view through a temperature-stabilized MEMS device, constructed and operative according to an embodiment of the present invention, the cross-section being taken perpendicular to a layered structure of the device.

The present invention is a temperature-stabilized MEMS device in which heat is generated by ohmic heating as an electric current passes through at least part of one of the structural layers of the device.

The principles and operation of MEMS devices according to the present invention may be better understood with reference to the drawings and the accompanying description.

Referring now to the drawings, FIGS. 1-6 illustrate various implementations of a MEMS device, constructed and operative according to certain aspects of the present invention. In general terms, the MEMS device of the present invention is formed from a plurality of layers including at least a substrate 1 and a device layer 25 supported by the substrate. Device layer 25 includes an active structure 3 which performs the desired function(s) of the MEMS system, and typically also a frame 2, supported by substrate 1 and surrounding active structure 3. In certain applications, a cover layer (or "cap") 8 overlies device layer 25, preferably cooperating with substrate 1 and frame 2 to form a sealed unit around active structure 3.

It is a particularly preferred feature of certain embodiments of the present invention that at least one of the layers is implemented as a doped silicon layer with first and second electrical connection regions located such that at least part of the doped silicon electrically connecting between the first and second electrical connection regions forms a resistive heating element thermally coupled to the active structure of the device layer.

Thus, the present invention preferably exploits the fact that doped silicon is a sufficiently good electrical conductor to be used directly as a resistive heat source. This allows use of part, or all, of one of the structural layers of the MEMS device as an ohmic heater, preferably without requiring additional processing steps to form a heating element. The heating element preferably extends through the entire thickness of the corresponding layer, although doping through only part of the layer could also be employed. The region of the layer forming the heating element preferably has the same composition as the remainder of the layer, thereby greatly simplifying production processes. A pre-doped off-the-shelf wafer of either n-type or p-type can advantageously be used.

According to a first set of implementations of the present invention, the doped silicon layer in which heating occurs is device layer 25. In this case, MEMS device-layer 25 is made from a relatively highly doped silicon wherein either the active structure or the seal ring additionally forms a heating element. By driving an electrical current through the heating element, ohmic heating occurs to supply the heat required to maintain the desired temperature of the MEMS active structure. This obviates the need for a separate heater element, and the corresponding manufacturing process steps.

Figure 2:
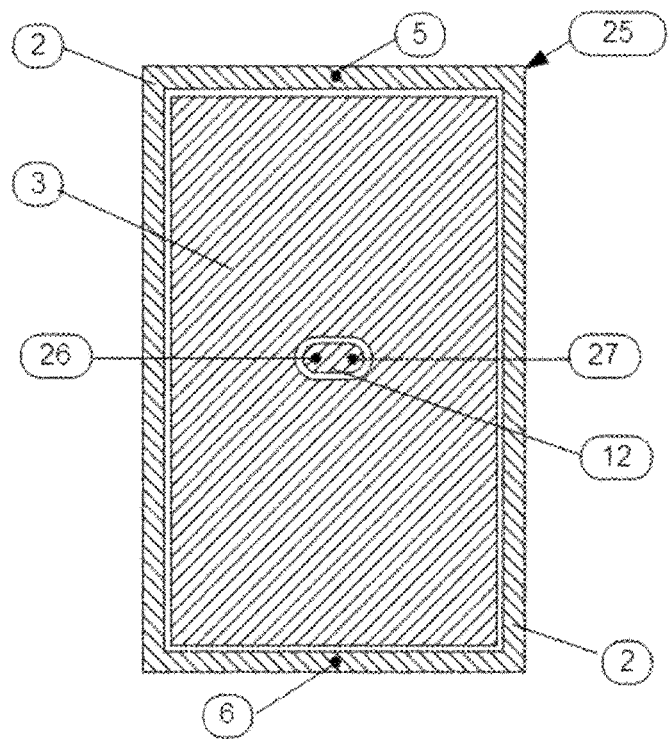
FIG. 2 is a schematic plan view of the device of FIG. 1.

Turning now to FIGS. 1 and 2, these illustrate a MEMS device without a cap according to one implementation of the present invention. Substrate 1 can be made of silicon, glass or other material. On top of the substrate layer lies device layer 25 which includes frame 2 and, schematically depicted, active structure 3. The active structure may be any MEMS device for which the mechanical properties can advantageously be maintained by keeping the active structure at a predefined controlled temperature (or within a range of temperatures). By way of one particularly preferred but non-limiting set of exemplary applications, the active structure of this and other embodiments of the present invention may advantageously form a MEMS gyroscope structure. Examples of suitable MEMS gyroscope implementations which may advantageously be implemented according to the teachings of the present invention include, but are not limited to, that of U.S. Pat. No. 9,303,994.

In the case illustrated here, as best seen in FIG. 2, pads 5 and 6 are used for electrically connecting to the conductive frame 2 and injecting a heat generating current, preferably as DC.

By way of one non-limiting example, if the device layer is made from a 100 μm thick Silicon with resistivity of 0.015 Ohm-cm then a seal ring 200 μm wide with dimensions of 4×6 mm would have a resistance of 50Ω. Applying 5 Volts on this resistance generates 500 mW of thermal power which is typically more than enough to hold the device at 90° C.—even at sub-zero ambient temperatures. (The required power is even less if the MEMS is packaged in vacuum, as exemplified in further examples below.)

Where heat is provided by current flowing through conductive frame 2, transfer of the heat to the active structure 3 is typically by heat conduction through substrate 1 and/or through cover 8 (where present).

In some cases, it may be sufficiently effective to operate the heating element(s) of the present invention without onboard temperature measurement, for example, using a predefined duty cycle of on/off based, for example, on an ambient temperature which may be input from an external sensor or other source. More preferably, in order to facilitate closed-loop control of the operating temperature of active structure 3, a temperature-responsive element 12 may advantageously be deployed to measure a temperature of at least part of the active structure. In particularly-preferred implementations, the temperature-responsive element is either a temperature sensing diode or a temperature sensing resistor, formed as part of device layer 25. Temperature-responsive element 12 is typically formed with first and second sensor-connection regions 26 and 27 for sensing an electrical property of the temperature-responsive element. The component structures and sensing techniques for deriving a temperature reading, or a signal related to a temperature reading, for either temperature sensing diode or a temperature sensing resistor are per se well known, and will not be discussed here in detail.

A controller 21 is preferably electrically connected to first and second sensor-connection regions 26 and 27, and to first and second electrical connection regions 5 and 6. Controller 21 is preferably configured to sense a signal from the temperature-responsive element that is indicative of a current temperature of the active structure, and to selectively apply a voltage across the resistive heating element so as to maintain the current temperature within a target range of temperatures.

Figure 6:
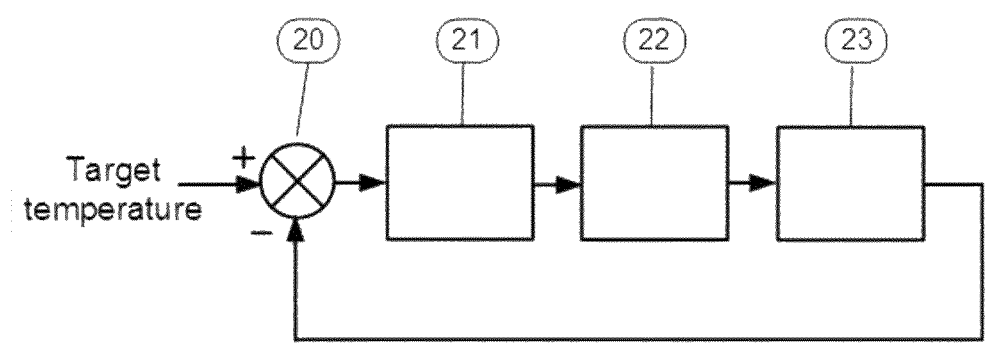
FIG. 6 is a schematic block diagram illustrating the interrelation of components making up an exemplary control system operating a temperature-stabilized MEMS device according to an embodiment of the present invention.

By way of one non-limiting example of an implementation of a control circuit, FIG. 6 illustrates a temperature sensor 23, which may be implemented as temperature-responsive element 12 described above combined with whatever additional circuitry is required to generate an output signal indicative of a current temperature of the active structure. This output signal is provided as an input to a comparator 20 where it is compared with a reference signal corresponding to a desired target temperature. The output from comparator 20 is used by controller 21 to control the power generated in the heating element 22, which is implemented as an integrated heating element according to one or more of the options described herein. It will be clear that the subdivision of the controller into blocks 20 and 21 is arbitrary for the purposes of illustration, and that the combination of these two elements, as well as circuitry associated with temperature sensor 23, may collectively be referred to as the "controller" of the system, and may be combined into a single microprocessor chip. The functions of the controller may be combined with other control or processing functions required by the MEMS device, all according to the particular requirements and design of the MEMS device.

The entire MEMS device is most preferably mounted on an underlying surface 13 of its package (not shown) via a number of legs 7 which are preferably made of glass or other material with low thermal conductivity in order to minimize heat loss to the package. Legs 7 maintain a spacing of substrate 1 away from underlying surface 13, thereby minimizing heat loss from the substrate to the surroundings.

Figure 3:
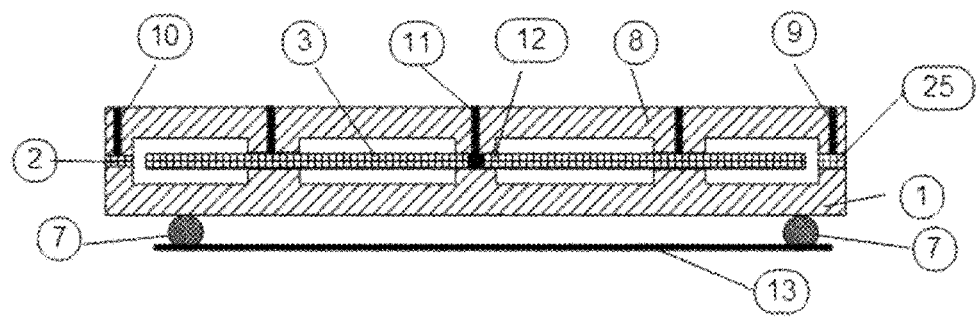
FIG. 3 is a schematic longitudinal cross-sectional view similar to FIG. 1 illustrating a variant implementation of a temperature-stabilized MEMS device including a cover.

Turning now to FIG. 3, this illustrates in cross-section a device similar to that of FIG. 1 wherein cover layer 8 is deployed over device layer 25, preferably forming a sealed unit, which may also be evacuated. This option is particularly preferred for gyroscope applications, in which air resistance may interfere with proper operation of the gyroscope. In this case, electrically conductive vias 9, 10 and 11 are used to electrically interconnect, respectively, to pads 5 and 6 and to first and second sensor-connection regions 26 and 27 (FIG. 2) for the aforementioned closed-loop temperature control. In all other respects, the structure and function of the device of FIG. 3 is equivalent to that described with respect to FIGS. 1 and 2, and the above description is relevant here also.

Figure 4:
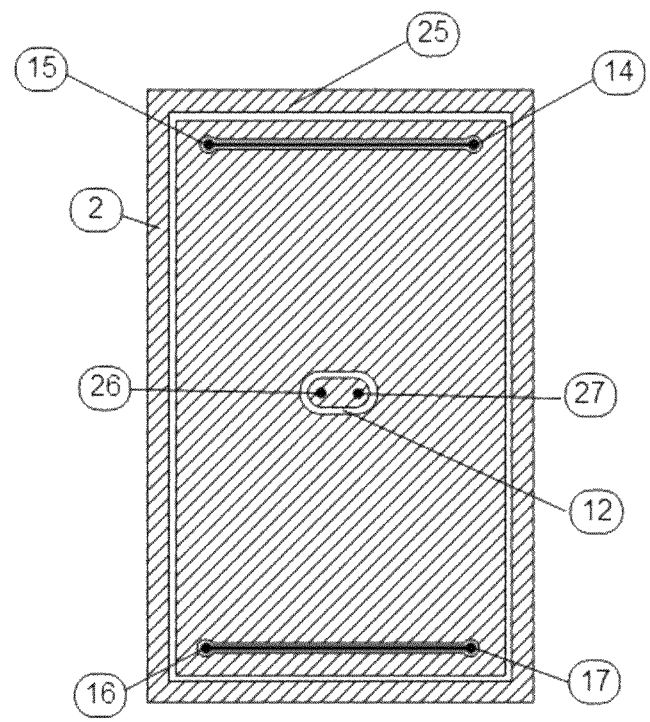
FIG. 4 is a schematic plan view similar to FIG. 2 illustrating a further variant implementation of a temperature-stabilized MEMS device in which heating elements are incorporated within the region of an active structure of a device layer.

Turning now to FIG. 4, this illustrates a further option according to which the heating element(s) is formed in device layer 25 within the region of the active structure. In the particularly preferred implementation shown here, each heating element is implemented as a conductive beam interconnecting between first and second electrical connection regions 14 and 15, or 16 and 17, such that the conductive beam forms the resistive heating element. Suitably positioned vias (not shown) provide the electrical connectivity to the heating elements. The beams may be straight beams, or any other form which can readily be accommodated within or around the active structure. The beams are most preferably electrically isolated from the surrounding portions of the active layer. Here too, heat conduction between the heating element(s) and the active structure is primarily via the substrate and/or cover, but the distances between the heating element and the adjacent portions of the active structure are very short, thereby facilitating heat transfer therebetween.

The device of FIG. 4 may be implemented either as an open structure or as a closed structure with a cover, and in all other respects is similar in structure and function to the implementations of FIGS. 1-3 described above, whose description applies here too.

Figure 5:
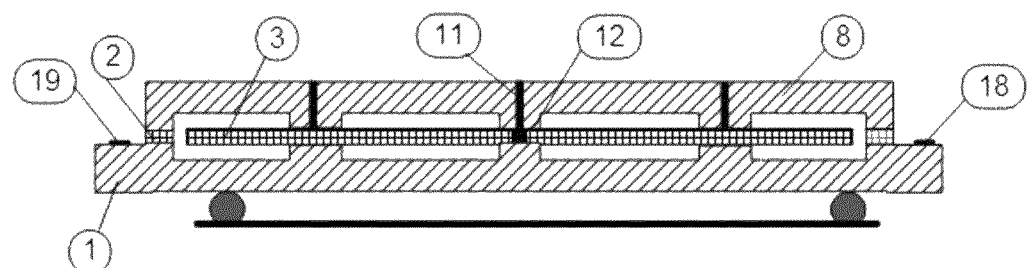
FIG. 5 is a schematic longitudinal cross-sectional view similar to FIG. 1 illustrating a further variant implementation of a temperature-stabilized MEMS device in which contacts are provided for using a substrate as a heating element.

Turning finally to FIG. 5, a further variant implementation employs a doped silicon layer as substrate 1 to provide the conductive heating element. In the implementation illustrated here, substrate 1 is formed with projecting shoulders which extend beyond the area covered by device layer 25 and cover 8, and provide contact pads 18 and 19 which are the electrical contact regions for the "heating element" which, in this case, is a portion, or the entirety, of the substrate. Similarly, by applying electrical contact regions (not shown) to cover 8, the bulk of the cover may be used as the "heating element" according to the teachings of the present invention. Given the relatively large cross-sectional area of the substrate or cover (compared to the frame 2 in the example calculation above), a lower level of doping may be used and/or a lower actuation voltage may be supplied, in order to keep the heating power at the required level, typically in the range of 10 mW to 500 mW.

In use, for all of the above variant implementations, a current temperature is preferably sensed that is indicative of a temperature of at least part of the active structure, and a voltage is selectively applied across the resistive heating element, either switched on/off or with a variable actuating voltage, so as to maintain the current temperature within a target range of temperatures, typically within ±5° C. of the target value, which is chosen to be above the expected range of ambient working temperatures.

Certain particularly preferred implementations of the present invention may thus offer one or more of the following advantages:

Minimal turn-on time (typically a fraction of a second).
    Minimal heat lost to unnecessary portions of the device.
    No extra production process steps needed for implementing the heater element.
    The heater element and the temperature sensing element integrated into the layers of the device structure, thereby simplifying electrical interconnection.

It will be appreciated that the above descriptions are intended only to serve as examples, and that many other embodiments are possible within the scope of the present invention as defined in the appended claims.

What is claimed is:

1. A hermetically sealed MEMS device comprising:
a plurality of layers including:
(a) a substrate;
(b) a silicon device layer supported by said substrate; and
(c) a cover layer overlying said device layer and forming, together with said substrate and said device layer, a hermetically sealed MEMS device,
wherein said device layer includes an active structure and a continuous frame surrounding said active structure,
wherein said device layer is implemented using a doped silicon layer with first and second electrical connection regions located such that at least part of said frame electrically connects between said first and second electrical connection regions and forms a resistive heating element thermally coupled through conduction via said substrate to said active structure.

2. The MEMS device of claim 1, further comprising a temperature-responsive element selected from the group consisting of: a temperature sensing diode and a temperature sensing resistor, said temperature-responsive element being thermally coupled to said device layer and having first and second sensor-connection regions for sensing an electrical property of said temperature-responsive element.

3. The MEMS device of claim 2, further comprising a controller electrically connected to said first and second sensor-connection regions and said first and second electrical connection regions, said controller being configured to receive a signal indicative of a current temperature of said temperature-responsive element, and to selectively apply a voltage across said resistive heating element so as to maintain said current temperature within a target range of temperatures.

4. The MEMS device of claim 1, further comprising a plurality of legs attached to said substrate for spacing said substrate away from an underlying surface.

5. A MEMS device comprising:
a plurality of layers including:
(a) a substrate;

(b) a silicon device layer supported by said substrate, said device layer including an active structure and a continuous frame surrounding said active structure; and (c) a cover layer deployed over said device layer such that said cover layer, said substrate and said frame form a sealed unit around said active structure, an interior of said sealed unit containing a vacuum, wherein said device layer is implemented using a doped silicon layer with first and second electrical connection regions located such that at least part of said frame electrically connects between said first and second electrical connection regions and forms a resistive heating element thermally coupled through conduction via said substrate and/or said cover layer to said active structure.

6. A method comprising the steps of:
   (a) providing the MEMS device of claim 5;
   (b) sensing a current temperature indicative of a temperature of at least part of the active structure; and
   (c) selectively applying a voltage across said resistive heating element so as to maintain said current temperature within a target range of temperatures.

7. The method of claim 6, wherein said sensing is performed using a temperature-responsive element selected from the group consisting of: a temperature sensing diode and a temperature sensing resistor, said temperature-responsive element being formed as part of said device layer.

8. The method of claim 6, employing a plurality of legs to deploy said substrate in spaced relation to an underlying surface.

* * * * *